United States Patent [19]
Bae et al.

[11] Patent Number: 5,978,310
[45] Date of Patent: *Nov. 2, 1999

[54] INPUT BUFFER FOR A SEMICONDUCTOR MEMORY DEVICE

[75] Inventors: Huy-Cheol Bae, Ich'on Kyoungki-do; Sang-Sup Bae, Seoul, both of Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/882,326

[22] Filed: Jun. 25, 1997

[30] Foreign Application Priority Data

Jun. 29, 1996 [KR] Rep. of Korea ................... 96-26323

[51] Int. Cl.⁶ ........................................ G11C 8/00
[52] U.S. Cl. ........................ 365/230.08; 365/233.5; 365/193
[58] Field of Search ............... 365/230.08, 193, 365/194, 233.5

[56] References Cited

U.S. PATENT DOCUMENTS

| | | | |
|---|---|---|---|
| 5,019,724 | 5/1991 | McClure | 307/443 |
| 5,036,227 | 7/1991 | Jo et al. | 307/480 |
| 5,600,607 | 2/1997 | Furutani et al. | 365/233.5 |
| 5,608,688 | 3/1997 | Park | 365/233.5 |

FOREIGN PATENT DOCUMENTS

| | | |
|---|---|---|
| 2139792 | 5/1990 | Japan . |
| 7-176183 | 7/1995 | Japan . |

OTHER PUBLICATIONS

Patent Abstracts of Japan 02139792 A, published May 29, 1990 Japanese Patent Application 01176089 Jul. 7, 1989 (Toshiba Corp.).

*Primary Examiner*—David Nelms
*Assistant Examiner*—Thong Le
*Attorney, Agent, or Firm*—Ware, Fressola, Van Der Sluys & Adolphson LLP

[57] ABSTRACT

An input buffer for a memory device which receives a row address strobe $\overline{RAS}$ and produces a RAS1 from which the noise signal is removed. The device has a buffer input for externally receiving the $\overline{RAS}$, a data output enable (DOE) locking portion for delaying the DOE signal for a predetermined time, and then producing a control signal for controlling the production of the output signal RAS1, and has a buffer output portion for receiving the $\overline{RAS}$ of the buffer input portion as an input signal and the control signal from the DOE locking portion, and producing the noise-free RAS1 in accordance with the control signal.

5 Claims, 2 Drawing Sheets

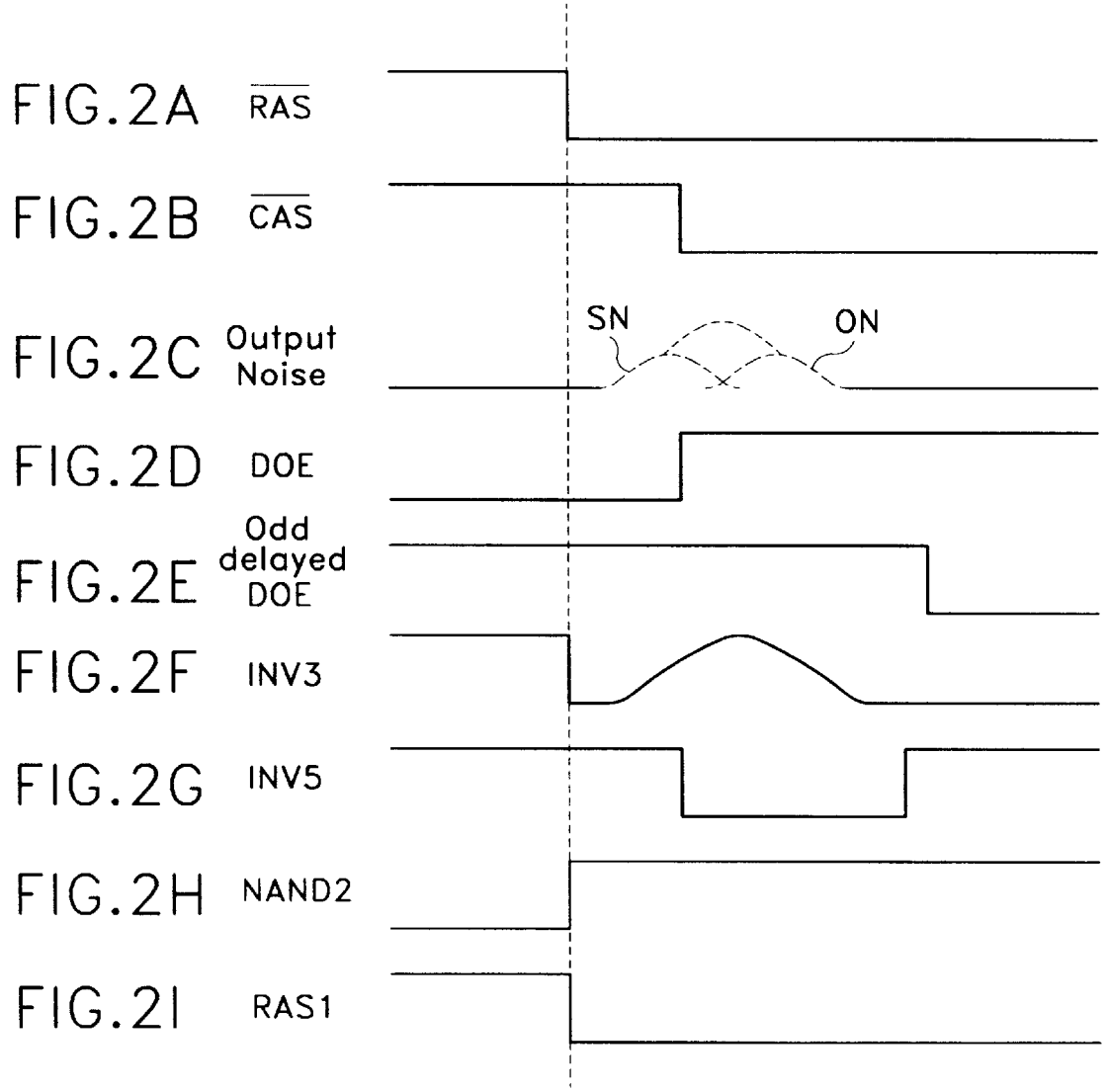

INPUT BUFFER FOR A SEMICONDUCTOR MEMORY DEVICE

BACKGROUND OF THE INVENTION

1. Field of the Invention

The present invention relates to an input buffer for a semiconductor memory device and, more particularly, to an input buffer for improving the noise characteristics of the memory device.

2. Discussion of Related Art

The operation of a memory device is greatly affected by various logic levels of external circuits, and external signals such as input/output impedance or noise. An input buffer utilizes and selects these external signals in accordance with the internal voltage level of the memory device. Such an input buffer should be designed to have no change of level due to noise once the logic level is defined. Additionally, the input buffer should have a voltage level as high as a logic low voltage $V_{IL}$, and have a voltage level as low a as logic high voltage $V_{IH}$, whereby the voltage levels are within a threshold voltage. The purpose of the above limitation in the range of the voltage level, is to enable a more rapid signal processing.

In the above described input buffer of a memory device, the output terminal is designed so as to sensitively change in accordance with the input signal level variation from HIGH to LOW or vice versa. This design is prone to cause circuit malfunctioning due to its over-sensitivity even in case of a slight change in the input signal due to noise. The input noise fed back to the output signal during reading of a data causes more problems to the memory device than writing of a data.

SUMMARY OF THE INVENTION

The object of the present invention is to provide an input buffer for a semiconductor memory device, designed to improve noise characteristics by responding only to the initial change of the input regardless of variations in the feedback output noise.

To achieve the purpose of the present invention, an input buffer includes: a buffer input portion for receiving the $\overline{RAS}$; a data output enable (DOE) locking portion for delaying a DOE signal for a predetermined time; and a buffer output portion for producing the $\overline{RAS}$ signal which is applied to the input portion in accordance to the DOE signal which is produced with a delay by the DOE locking portion. In addition, the DOE signal is synchronized with the CAS signal which is used while reading a data from memory device.

Furthermore, the input buffer of the present invention ignores the variation of the input signal caused by noise of the output signal for a predetermined time and thus reacts only to the initial change of the input signal. The input buffer operates according to the changes of the input signal only after the output noise decreases, thus improving the output characteristics.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein:

FIG. 1 is a diagram of an input buffer according to an embodiment the present invention; and FIGS. 2A–2I show the timed operation of the input buffer of the present invention depicted in FIG. 1.

DETAILED DESCRIPTION OF PREFERRED EMBODIMENT

Figure 1:
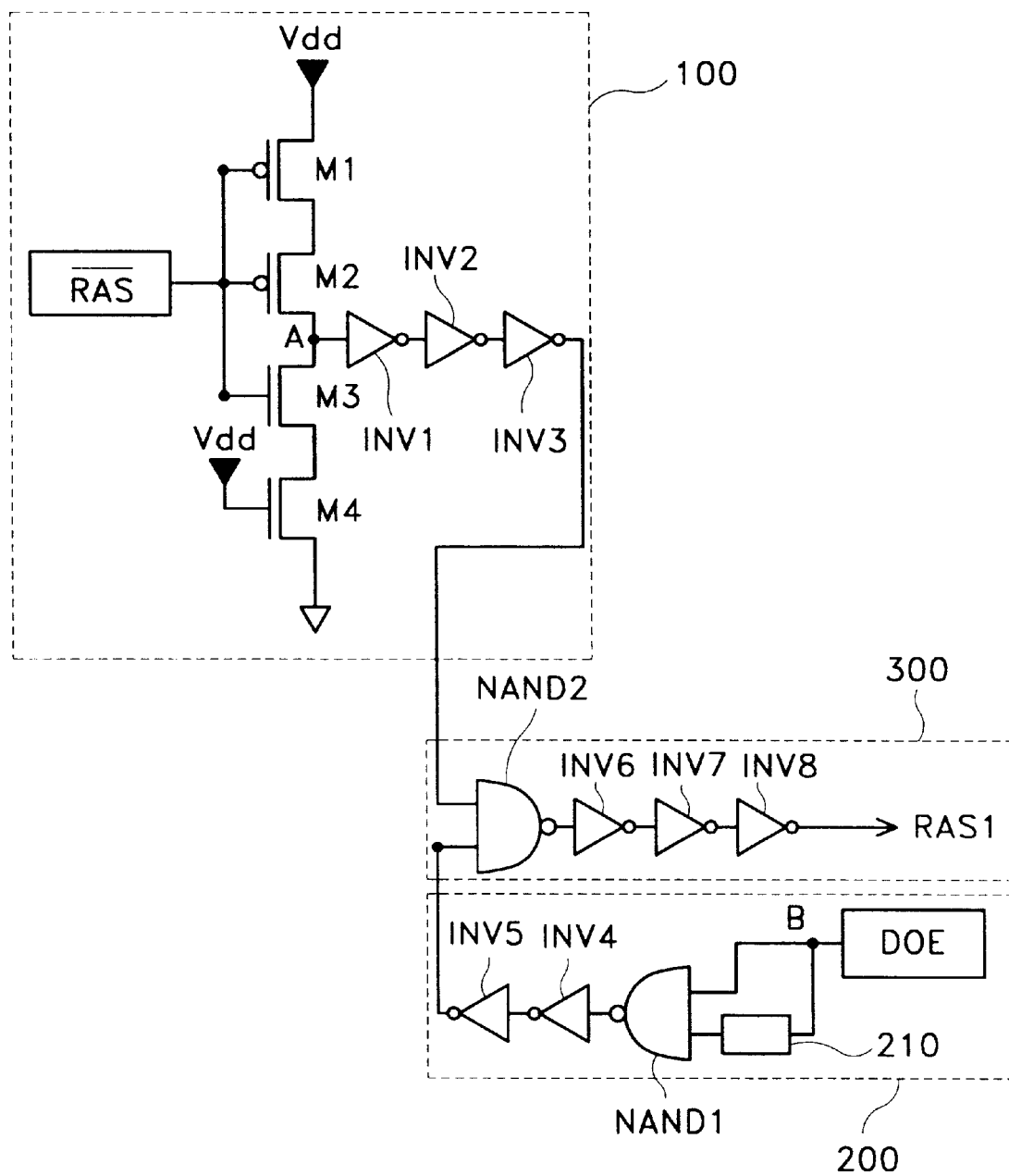

A detailed description of one embodiment of the present invention is provided below with reference to the accompanying drawings.

Referring to FIG. 1, an input buffer circuit of the present invention comprises a buffer input portion 100 for receiving a row address strobe $\overline{RAS}$ as the input signal, a data output enable (DOE) locking portion 200 for delaying the DOE signal for a predetermined period, and a buffer output portion 300 for producing $\overline{RAS}$ output from the buffer input portion 100 which is produced according to the output signal of DOE locking portion 200.

First of all, buffer input portion 100 includes: first, second and third MOS transistors M1, M2 and M3 connected in series to one another wherein $\overline{RAS}$ signal is applied to each of their respective gates; and a fourth MOS transistor M4 serially connected to the third MOS transistor M3 wherein the operation voltage Vdd is applied to a gate of the fourth MOS transistor M4. In the present embodiment, the first and second MOS transistors M1 and M2 are PMOS transistors, and the third and fourth is an NMOS transistor.

The second and third transistors M2 and M3 are connected to inverters INV1, INV2 and INV3 which inverts the output of the series connected node A. More specifically, the first inverter INV1 inverts the output signal of node A, and the second inverter INV2 inverts the output signal of the first inverter INV1. The third inverter INV3 inverts the output signal of the second inverter INV2. A buffer input portion 100, including the first, second and third inverters INV1, INV2 and INV3, produces the $\overline{RAS}$ through the third inverter INV3.

The DOE locking portion 200 includes: an odd delay portion 210 for delaying the externally applied DOE for a predetermined period; a first NAND gate NAND1 for performing a NAND function of the externally applied DOE signal and the delayed DOE signal from the odd delay portion 210; a fourth inverter INV4 for inverting the output of first NAND gate NAND1, and a fifth inverter INV5 for inverting the output of the fourth inverter INV4. The delay period of odd delay 210 is set to 12 ns–15 ns in consideration of the expected period of the output noise, the conversion period of $\overline{RAS}$, and the conversion period of $\overline{CAS}$.

Buffer output portion 300 includes: a second NAND gate NAND2 for receiving the output of the third inverter INV3 of the buffer input portion 100 and the output signal of fifth inverter INV5 of the DOE locking portion 200 through node B; a sixth inverter INV6 for inverting the output of a second NAND gate NAND2; a seventh inverter INV7 for inverting the output of sixth inverter INV6; and an eighth inverter INV8 for inverting the output of seventh inverter INV7 which is the RAS1 signal.

FIGS. 2A–2I are diagrams of timed operation showing $\overline{RAS}$, DOE signal, $\overline{CAS}$, external noise, odd delayed DOE signal, the output signals of INV3 and INV5, the output signal of NAND2, and RAS1 signal.

When the $\overline{RAS}$ changes from LOW to HIGH, the output at the node A is changed from LOW to HIGH. Here, the node B is maintained at a HIGH level because the DOE signal in synchronization with $\overline{CAS}$ continues to be in LOW state for a predetermined period. Therefore the output of the second NAND gate NAND2 is determined by the output signal of the second inverter INV2 of the buffer input portion 100.

After the $\overline{CAS}$ signal is changed from HIGH to LOW, the DOE synchronized with the $\overline{CAS}$ signal as a result changes from LOW to HIGH. After the falling of the logic levels of the $\overline{RAS}$ and $\overline{CAS}$ signals, sensing noise SN and output noise ON occur respectively. Here, when the DOE signal becomes enabled or HIGH, the output of the first NAND gate NAND1 is maintained to be LOW only for the delay time of the odd delay 210, 12 ns–15 ns, while the output of second NAND gate NAND2 is maintained HIGH regardless of the change of the input signal. Thus, the buffer is prevented from malfunctioning due to the output noise when $\overline{RAS}$ is changed from HIGH to LOW.

As described above, the input buffer of the present invention ignores the variation of the input signal for a predetermined time and reacts only to the initial change of the input signal even if the output noise of the memory device occurred during the conversion of $\overline{RAS}$ from HIGH to LOW is fed to the input signal of the input buffer. The input buffer operates in accordance with variation of the input signal after the output noise is decreased, thus improving the input characteristics of a multi-output memory device involving relatively large output noise. In short, the present invention implements an input buffer which improves the input characteristics of the multi-output memory devices.

It will be apparent to those skilled in the art that various modifications and variations can be made in the input buffer for a semiconductor memory device of the present invention without departing from the spirit or scope of the invention. Thus, it is intended that the present invention cover the modifications and variations of this invention provided they come within the scope of the appended claims and their equivalents.

What is claimed is:

1. An input buffer for a memory device which receives a row address strobe $\overline{RAS}$ and produces an output signal RAS1 for which noise is removed, the buffer comprising:

a buffer input portion for externally receiving $\overline{RAS}$;

a data output enable (DOE) locking portion for delaying a DOE signal for a predetermined time, and then producing a control signal for controlling the production of the output signal RAS1; and a buffer output portion for receiving the $\overline{RAS}$ of the buffer input portion as an input signal and the control signal from the DOE locking portion, and producing the noise-free RAS1 in accordance to the control signal.

2. The input buffer as claimed in claim 1, wherein the buffer input portion which receives the $\overline{RAS}$ comprises:

a first transistor having a source terminal to which a driving voltage is applied, a drain terminal, and a gate terminal to which the $\overline{RAS}$ is externally applied;

a second transistor having a source terminal connected to the drain terminal of the first transistor, a drain terminal, and a gate terminal to which the $\overline{RAS}$ is externally applied;

a third transistor having a drain terminal connected to the drain terminal of the second transistor and producing an inverted $\overline{RAS}$, a source terminal, and a gate terminal to which the inverted $\overline{RAS}$ is externally applied;

a fourth transistor having a drain terminal connected to the source terminal of the third transistor, a source grounded terminal, and a gate terminal to which the driving voltage is applied;

a first inverter for inverting the signal output from a node which connects the drain terminal of the second transistor and the drain terminal of the third transistor;

a second inverter for inverting the signal output from the first inverter; and a third inverter for inverting the signal output from the second inverter.

3. The input buffer as claimed in claim 2, wherein the first and second transistors are PMOS transistors, and the third and fourth transistors are NMOS transistors.

4. The input buffer as claimed in claim 2, wherein the DOE locking portion comprises:

an odd delay portion for inverting and delaying the DOE externally applied for a predetermined time;

a first NAND gate for performing a NAND function of the externally applied DOE as a first input and an inverted and delayed DOE from the odd delay portion as a second input;

a fourth inverter for inverting output of the first NAND gate; and a fifth inverter for inverting output of the fourth inverter.

5. The buffer as claimed in claim 4, wherein the buffer output portion comprises:

a second NAND gate for performing a NAND function of two signals input from the buffer input portion and the DOE locking portion;

a sixth inverter for inverting the output of the second NAND gate;

a seventh inverter for inverting the output of the sixth inverter; and an eighth inverter for producing RAS1 which is an inverted signal of the output signal of the seventh inverter.

* * * * *